United States Patent [19]

Nomura et al.

[11] Patent Number: 4,487,842
[45] Date of Patent: Dec. 11, 1984

[54] LOW-LOSS MICROWAVE DIELECTRIC MATERIAL

[75] Inventors: Shoichiro Nomura, Tokyo; Yoshihiro Konishi, Sagamihara, both of Japan

[73] Assignee: Nippon Hoso Kyokai, Tokyo, Japan

[21] Appl. No.: 495,807

[22] Filed: May 18, 1983

[30] Foreign Application Priority Data

May 26, 1982 [JP] Japan .................................. 57-88066

[51] Int. Cl.$^3$ .............................................. C04B 35/00
[52] U.S. Cl. ...................................... 501/135; 264/65; 264/66
[58] Field of Search ............... 501/135, 134, 136, 137; 264/65, 66

[56] References Cited

U.S. PATENT DOCUMENTS

| | | | |
|---|---|---|---|
| 3,464,785 | 9/1969 | Galasso | 501/137 |
| 3,673,119 | 6/1972 | Ueoka et al. | 501/137 |
| 4,121,941 | 10/1978 | Kawashima et al. | 501/135 |
| 4,353,047 | 10/1982 | Noguchi et al. | 501/137 |

FOREIGN PATENT DOCUMENTS

| | | | |
|---|---|---|---|
| 53-60540 | 5/1978 | Japan | 501/135 |
| 55-32723 | 3/1980 | Japan | 501/135 |
| 55-68004 | 5/1980 | Japan | 501/135 |
| 56-103803 | 8/1981 | Japan | 501/135 |
| 56-96769 | 8/1981 | Japan | 501/135 |

OTHER PUBLICATIONS

Nomura, S. et al., "Effect of Mn Doping on Ceramics with a Low-Loss and a High Dielectric Constant in X Band"—Japanese Applied Physics Ass'n Conference (Apr. 1982) Paper 2a-I-4, p. 763.

Primary Examiner—Helen M. McCarthy
Attorney, Agent, or Firm—Fliesler, Dubb, Meyer & Lovejoy

[57] ABSTRACT

A low-loss microwave dielectric material comprising a sinter of a mixture of a perovskite type structure compound oxide comprising singly or mainly $Ba(Zn_{1/3}Ta_{2/3})O_3$ and $Ba(Mg_{1/3}Ta_{2/3})O_3$ with a small amount of Mn. Mn addition not only favorably affects sinterability to lower the required sintering temperature but also advantageously heightens the unloaded Q factor of the resulting sinter in an SHF band.

17 Claims, 4 Drawing Figures

FIG_3

LOW-LOSS MICROWAVE DIELECTRIC MATERIAL

BACKGROUND OF THE INVENTION

1. Field of the Invention

The present invention relates to a low-loss microwave dielectric material suited for use in a circuit processing electric signals of microwaves, for example, in an SHF band, and to a process for preparing the same.

2. Prior Art of the Invention

A low-loss dielectric material is used for a dielectric resonator in an SHF band circuit. More specifically, the dielectric resonator is coupled with a filter, a Gunn oscillator or an FET oscillator. Thus, it is an indispensable element for stabilizing frequency. The dielectric resonator is used in a receiver for broadcasting via a broadcasting satellite or SHF broadcasting on ground. For improving the performance of the receiver, there has been a serious demand for an improvement in Q factor of the dielectric resonator. For the purpose, the dielectric material of the resonator is required to have a relative dielectric constant of 25 to 40, an unloaded Q factor of $10^4$ or more and a temperature coefficient of resonant frequency of within $\pm 10$ ppm/°C. in a 10 GHz band and at about room temperature.

Examples of conventional dielectric materials practically used as a resonator satisfying the above-mentioned requirements include ceramics of, for example, $Ba_2Ti_9O_{20}$, and ceramics of $(Zn_{0.8}Sn_{0.2})TiO_4$. These materials satisfy the above-mentioned conditions as regards relative dielectric constant and the temperature coefficient of resonant frequency but not unloaded Q factor. The unloaded Q factors of the $Ba_2Ti_9O_{20}$ and $(Zn_{0.8}Sn_{0.2})TiO_4$ ceramics with the addition of 0.5-2.0 mol % Mn are about 5000 in 7-10 GHz band (see "Effect of Mn Doping on Ceramics with a Low Loss and a High Dielectric Constant in X band" by Shoichiro Nomura et al., Japanese Applied Physics Association-Conference Paper 2a-I-4 (p. 763), April, 1982). Thus, no material has been found that satisfies all the above-mentioned three conditions.

In this age expecting practical broadcasting via a broadcasting satellite in the near future, there has been an ever-increasing necessity for a dielectric material meeting all the above-mentioned conditions.

SUMMARY OF THE INVENTION

It is, therefore, an object of the present invention to provide a low-loss microwave dielectric material having not only required relative dielectric constant and temperature coefficient thereof but also a high unloaded Q factor of $10^4$ or more.

Another object of the present invention to provide a low-loss microwave dielectric material which is formed at a relatively lower sintering temperature so as to obtain ceramics having a high unloaded Q factor.

Further object of the present invention is to provide a process for preparing a low-loss microwave dielectric material of the kind as described above.

In accordance with one aspect of the present invention, there is provided a low-loss microwave dielectric material comprising a sinter of a solid solution of a perovskite type structure compound oxide comprising singly or mainly at least one member selected from the group consisting of $Ba(Zn_{\frac{1}{3}}Ta_{\frac{2}{3}})O_3$ and $Ba(Mg_{\frac{1}{3}}Ta_{\frac{2}{3}})O_3$ with a small amount of Mn, less than 5 mol %, preferably in the range of 0.5-2.5 mol %.

The perovskite type structure compound oxide preferably includes $Ba(Zn_{\frac{1}{3}}Nb_{\frac{2}{3}})O_3$ and/or $Ba(Mg_{\frac{1}{3}}Nb_{\frac{2}{3}})O_3$ in addition to the main component, $Ba(Zn_{\frac{1}{3}}Ta_{\frac{2}{3}})O_3$ and/or $Ba(Mg_{\frac{1}{3}}Ta_{\frac{2}{3}})O_3$, the amount of which is preferably within 25 mol %. The amount of Mn is preferably in the range of 0.5-2.5 mol %, more preferably 1.0 mol %.

In accordance with another aspect of the present invention, there is provided a process for preparing a low-loss microwave dielectric material comprising the steps of:

(1) adding a small amount of Mn to a perovskite type structure compound oxide comprising singly or mainly at least one member selected from the group consisting of $Ba(Zn_{\frac{1}{3}}Ta_{\frac{2}{3}})O_3$ and $Ba(Mg_{\frac{1}{3}}Ta_{\frac{2}{3}})O_3$, and (2) sintering the resulting mixture.

The preferred sintering atmosphere is nitrogen and/or air. Mn is added preferably in the form of manganese carbonate or manganese oxide to the compound oxide. Alternatively, Mn may be added to the compound oxide by treating a powder of calcined perovskite type structure compound oxide with an aqueous solution of $MnSO_4 \cdot 4H_2O$ or $MnSO_4$. The sintering temperature is preferably 1550° C. to 1600° C., depending upon the composition. The sintering period of time is preferably 2 to 3 hours.

Since the low-loss microwave dielectric material of the present invention is in the form of a porcelain, the process for preparing the same may involve the two steps of calcination and sintering.

It has been recognized that a porosity of ceramic affects an unloaded Q factor. If a porosity is more than 3%, an unloaded Q factor is less than 9000. A preferable porosity is substantially within the range of 1-3% in order to obtain a high unloaded Q factor.

DETAILED DESCRIPTION OF PREFERRED EMBODIMENTS

Figure 1:
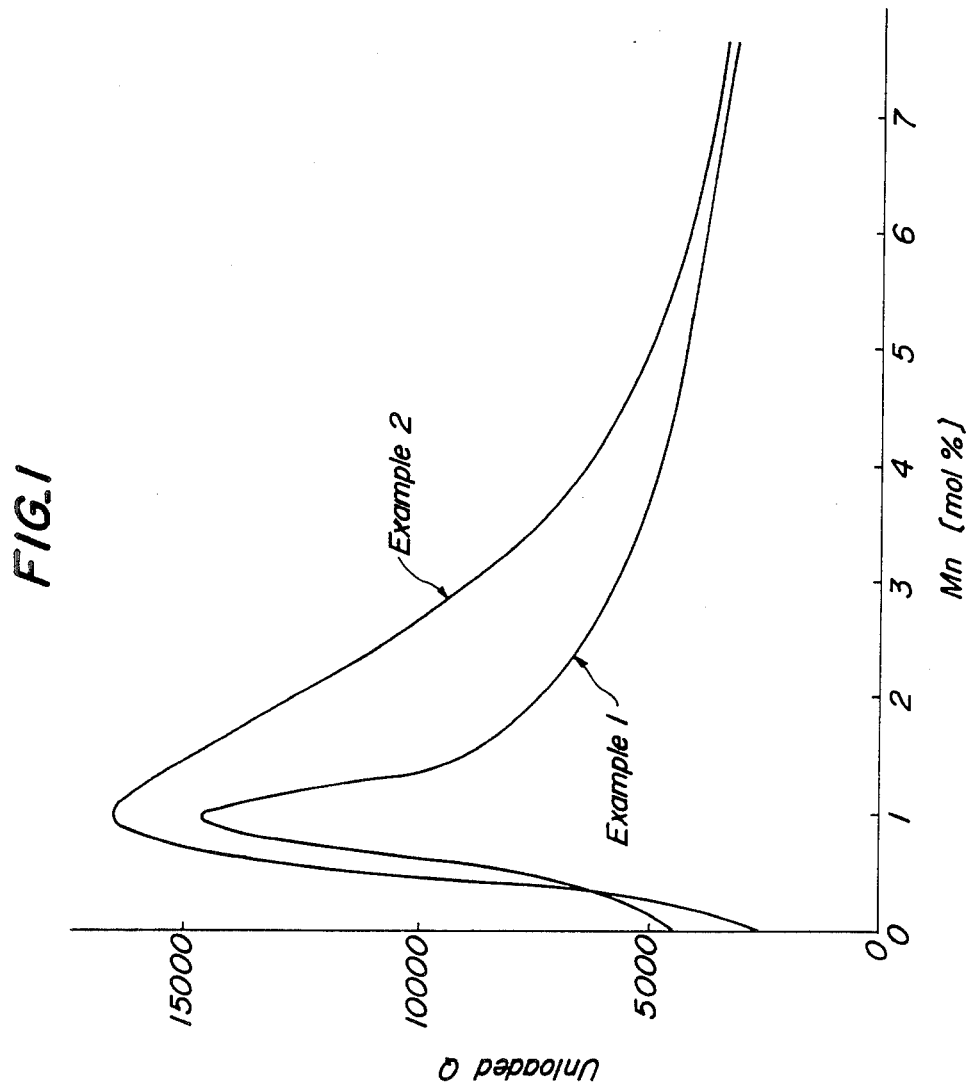
FIG. 1 illustrates the change of unloaded Q in accordance with the change of an amount of Mn addition.

The following Examples illustrate the present invention in more detail but should not be construed as limiting the scope of the invention.

EXAMPLES 1-4

In Example 1, a low-loss microwave dielectric material was prepared which is a sinter of a mixture including $Ba(Zn_{\frac{1}{3}}Ta_{\frac{2}{3}})O_3$ as the main component.

$BaCO_3$, $ZnO$ and $Ta_2O_5$, which are all above 99.9 wt. % in purity, and which were weighed to be in a molar oxide ratio of $1:\frac{1}{3}:\frac{2}{3}$, were mixed with ethanol and ball-milled using agate balls for 5 to 10 hours, followed by drying. The resulting mixture was calcined twice or three times in a porcelain alumina crucible in an atmosphere of air at 1,000° to 1,400° C. for 10 hours twice or three times. The calcined oxide powder was Mn-treated with an aqueous solution of $MnSO_4.4H_2O$. The oxide powder thus Mn-treated was again calcined in the porcelain alumina crucible in an atmosphere of air at 1200° C. to 1400° C. for 10 hours.

Subsequently, the resulting powder was pressure-molded under 400 kg/cm² and sintered in an atmosphere of air at 1550° C. to 1600° C. for 1 to 2 hours. A dense ceramic having a porosity within 3% was obtained.

A Mn-treated ceramic of $Ba(Zn_{\frac{1}{3}}Ta_{\frac{2}{3}})O_3$ prepared in Example 1 according to the process of this invention was 30 in relative dielectric constant, 15,000 in unloaded Q factor and within 0.5 ppm/°C. in temperature coefficient of resonant frequency in 11 GHz band.

A Mn-treated ceramic of each of the following compounds in Examples 2-4 had the characteristics listed in Table 1.

TABLE 1

| Example | Compound | Sintering temperature (°C.) | Relative dielectric constant in 10 GHz band | Unloaded Q | Temperature coefficient of resonant frequency (ppm/°C.) in 10 GHz band |
|---|---|---|---|---|---|
| 2 | $Ba(Mg_{\frac{1}{3}}Ta_{\frac{2}{3}})O_3$ | 1550 | 25 | 16800 | 3.8 |
| 3 | $Ba(Mg_{\frac{1}{3}}Nb_{\frac{2}{3}})O_3$ | 1500 | 32 | 6000 | 32.9 |
| 4 | $Ba(Zn_{\frac{1}{3}}Nb_{\frac{2}{3}})O_3$ | 1550 | 40 | 9000 | 30.9 |

(Examples 2 and 4 contain 1.0 mol % of Mn. Example 3 contains 2.0 mol % of Mn.)

A 1 mol % Mn-added sinter of $Ba(Mg_{\frac{1}{3}}Ta_{\frac{2}{3}})O_3$ prepared in Example 2 was 26 in relative dielectric constant, 17,000 in unloaded Q factor and within 5 ppm/°C. in temperature coefficient of resonant frequency in 11 GHz band.

FIG. 1 illustrates the change of unloaded Q in accordance with the change of an amount of Mn addition in Examples 1 and 2. The result illustrated in FIG. 1 shows that the amount was preferably within a range of 0.5-5 mol %, and more preferably in the range of 0.5-2.5 mol % and that the most preferable unloaded Q was obtained at 1 mol %.

Figure 2:
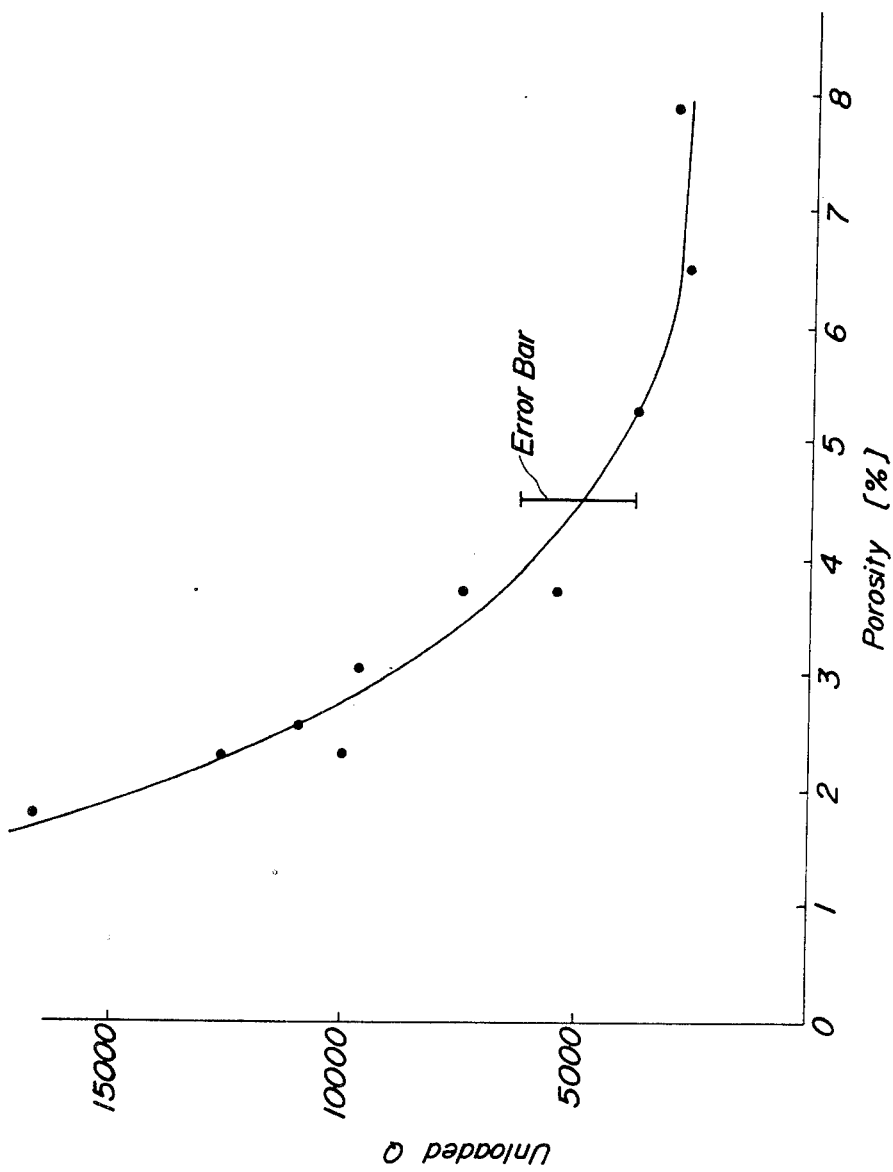
FIG. 2 illustrates the relationship between porosity(%) and unloaded Q.

FIG. 2 illustrates the relationship between porosity(%) and unloaded Q in 10-11 GHz band in Example 2. The result in FIG. 2 shows that a preferable porosity was within the range of 1-3% in order to obtain an unloaded Q of more than 9000.

EXAMPLES 5-9

In Example 5, a low-loss microwave dielectric material was prepared which is a sinter of a mixture including $Ba(Mg_{\frac{1}{3}}Ta_{\frac{2}{3}})O_3$ as the main component and $Ba(Zn_{\frac{1}{3}}Nb_{\frac{2}{3}})O_3$.

Substantially the same procedures as in Example 1 except that $BaCO_3$, MgO, ZnO, $Ta_2O_3$ and $Nb_2O_3$ were used as the raw materials in a molar proportion of 1:0.8/3:0.⅔:0.8/3:0.⅔ were repeated to prepare a dense porcelain having a porosity of 2%. The low-loss microwave dielectric material of the present invention can be in the form of a ceramic having a high Q factor by the addition of a small amount of Mn (1-2 mol %)to the raw materials or by the treatment of the calcined powder of the raw materials with a Mn solution. Without Mn addition, a dense ceramic cannot be obtained even if sintering is carried out at 1600° C. for any long period of time, and the Q factor attainable is at most 6,000.

A sinter prepared in the form of a ceramic according to the process of this invention can be fabricated into a desired shape by means of a diamond cutter.

Dielectric materials prepared from Mn-added mixtures of compound oxide such as a combination of $(1-x)Ba(Zn_{\frac{1}{3}}Nb_{\frac{2}{3}})O_3$ and $xBa(Mg_{\frac{1}{3}}Ta_{\frac{2}{3}})O_3$, a combination of $(1-x)Ba(Zn_{\frac{1}{3}}Ta_{\frac{2}{3}})O_3$ and $xBa(Mg_{\frac{1}{3}}Ta_{\frac{2}{3}})O_3$, a combination of $(1-x)Ba(Zn_{\frac{1}{3}}Ta_{\frac{2}{3}})O_3$ and $xBa(Mg_{\frac{1}{3}}Nb_{\frac{2}{3}})O_3$, a combination of $(1-x)Ba(Zn_{\frac{1}{3}}Nb_{\frac{2}{3}})O_3$ and $xBa(Zn_{\frac{1}{3}}Ta_{\frac{2}{3}})O_3$, or a combination of $(1-x)Ba(Mg_{\frac{1}{3}}Nb_{\frac{2}{3}})O_3$ and $xBa(Mg_{\frac{1}{3}}Ta_{\frac{2}{3}})O_3$, wherein $0 \leq x \leq 1$, are, in general, low in temperature coefficient of relative dielective constant.

Examples 6-9 in Table 2 show these dielectric materials. Further, in Table 2, the characteristics in Example 5 are also shown.

TABLE 2

| Example | Compound | Sintering temperature (°C.) | Relative dielectric constant in 10 GHz band (*9 GHz band) | Unloaded Q | Temperature coefficient of resonant frequency (ppm/°C.) in 10 GHz band (*9 GHz band) |
|---|---|---|---|---|---|
| 5 | $0.5Ba(Mg_{\frac{1}{3}}Ta_{\frac{2}{3}})O_3$—$0.5Ba(Zn_{\frac{1}{3}}Nb_{\frac{2}{3}})O_3$ | 1580 | 29.7 | 9400 | 9.5 |
| 6 | $0.25Ba(Mg_{\frac{1}{3}}Ta_{\frac{2}{3}})O_3$—$0.75Ba(Zn_{\frac{1}{3}}Ta_{\frac{2}{3}})O_3$ | 1600 | 27.3 | 10000 | 1.3 |
| 7 | $0.5Ba(Mg_{\frac{1}{3}}Ta_{\frac{2}{3}})O_3$—$0.5Ba(Zn_{\frac{1}{3}}Ta_{\frac{2}{3}})O_3$ | 1600 | 26.8 | 11000 | 2.3 |
| 8 | $0.9Ba(Mg_{\frac{1}{3}}Ta_{\frac{2}{3}})O_3$—$0.1Ba(Zn_{\frac{1}{3}}Ta_{\frac{2}{3}})O_3$ | 1600 | 25.0 | 11000 | 2.9 |
| 9 | $0.75Ba(Zn_{\frac{1}{3}}Ta_{\frac{2}{3}})O_3$—$0.25Ba(Mg_{\frac{1}{3}}Nb_{\frac{2}{3}})O_3$ | 1550 | 30.0* | 8000 | 6.4* |

(All the examples contain 1.0 mole % of Mn.)

Especially, ceramics prepared from Mn-added mixtures of compound oxide having a composition close to $Ba(Zn_{\frac{1}{3}}Ta_{\frac{2}{3}})O_3$ (Example 6) or $Ba(Mg_{\frac{1}{3}}Ta_{\frac{2}{3}})O_3$ (Example 8) are within +5 ppm/°C. in temperature coefficient of resonant frequency.

Figure 3:
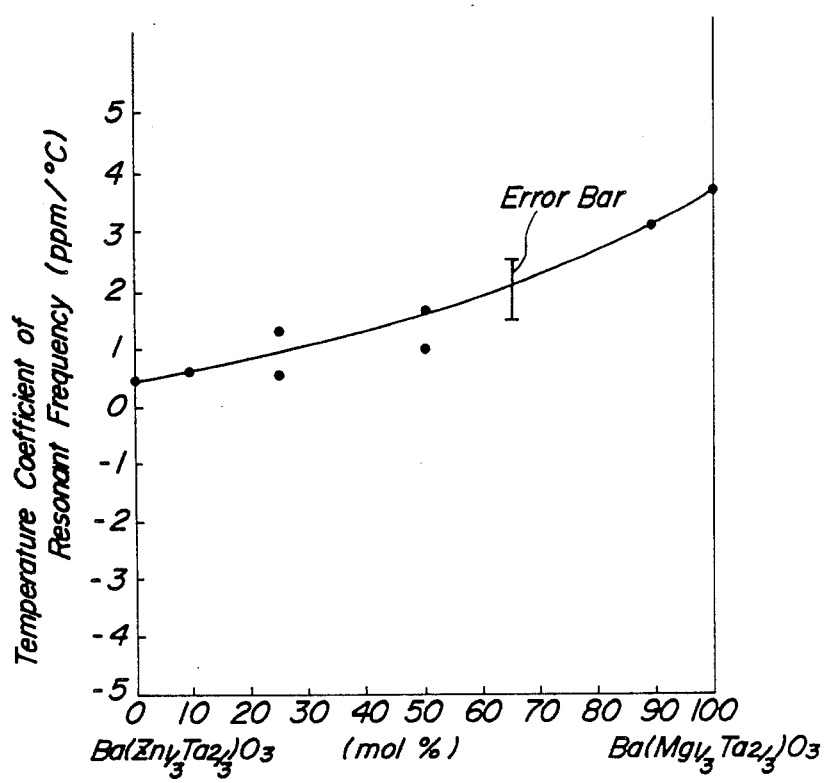
FIG. 3 illustrates the relationship of a temperature coefficient of resonant frequency and a mol % ratio of the compositions of $Ba(Zn_{\frac{1}{3}}Ta_{\frac{2}{3}})O_3$ and $Ba(Mg_{\frac{1}{3}}Ta_{\frac{2}{3}})O_3$ with an addition of 1 mol % of Mn in 9-11 GHz band.

FIG. 3 illustrates the relationship of a temperature coefficient of resonant frequency and a mol % ratio of the compositions of $Ba(Zn_{\frac{1}{3}}Ta_{\frac{2}{3}})O_3$ and $Ba(Mg_{\frac{1}{3}}Ta_{\frac{2}{3}})O_3$ with an addition of 1 mol % of Mn in 9-11 GHz band. FIG. 3 shows that the temperature coefficient was within the range of 0-4 ppm/°C.

A Q-factor improvement by Mn addition applies to $Ba_2Ti_9O_{20}$ and $Zn_{0.8}Sn_{0.2}TiO_4$ ceramics which have conventionally been employed as resonator material. 1,400° C.-sintered ceramics respectively prepared from a 1 mol % Mn-added mixture of $Ba_2Ti_9O_{20}$ and a 0.5 mol % Mn-added mixture of $Zn_{0.8}Sn_{0.2}TiO_4$ are 5,000 and 6,000, respectively, in unloaded Q factor in 10 GHz band, which are higher than those of the corresponding conventional ceramics.

Mn addition in the preparation of oxide ceramics not only favorably affects sinterability to comparatively lower the required sintering temperature, but also advantageously heightens the unloaded Q factor in an SHF band.

Figure 4:
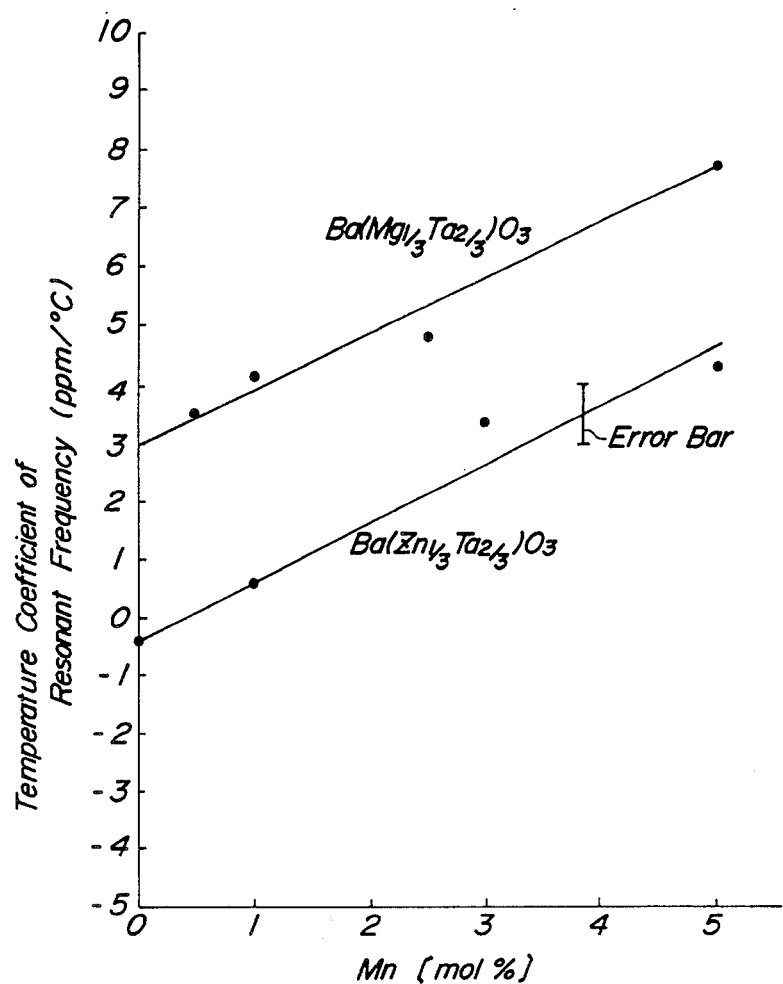
FIG. 4 illustrates the dependency of a temperature coefficient of resonant frequency upon an amount of Mn addition.

Furthermore, a temperature coefficient of resonant frequency can finely be adjusted by adequately controlling an amount of Mn addition. FIG. 4 illustrates the dependency of a temperature coefficient of resonant frequency upon an amount of Mn addition in 9–11 GHz band.

The dielectric material of the present invention is simple in preparation as compared with those materials of single crystal, and, hence, is adapted to mass production.

The dielectric material of the present invention is quite stable in air and satisfactory in mechanical strength inherently in high temperature sintered-ceramics. Further to the advantage of preparation of the dielectric material of this invention, Mn addition enables the sintering temperature to be lowered, so that various defects conventionally involved in sintering above 1,600° C. can be obviated such as considerable consumption of a furnace material, a raw material container and a heating body and possible infiltration and diffusion of impurities into the desired product during the course of sintering.

What is claimed is:

1. A low-loss microwave dielectric ceramic consisting essentially of a sinter of a mixture of a perovskite type structure compound oxide having a porosity in the range of 1 to 3% consisting essentially solely or mainly of at least one member selected from the group consisting of $Ba(Zn_{\frac{1}{3}}Ta_{\frac{2}{3}})O_3$ and $Ba(Mg_{\frac{1}{3}}Ta_{\frac{2}{3}})O_3$ with Mn having an amount within the range of 0.5–5 mol %.

2. A low-loss microwave dielectric ceramic as claimed in claim 1, wherein the amount of Mn is within the range of 0.5–2 mol %.

3. A low-loss microwave dielectric ceramic as claimed in claim 1, wherein said perovskite type structure compound oxide further contains less than 25 mol % of at least one member selected from the group consisting of $Ba(Zn_{\frac{1}{3}}Nb_{\frac{2}{3}})O_3$ and $Ba(Mg_{\frac{1}{3}}Nb_{\frac{2}{3}})O_3$.

4. A low-loss microwave dielectric ceramic as claimed in claim 1, wherein said sinter is one prepared in a sintering atmosphere of at least one member selected from the group consisting of nitrogen and air.

5. A low-loss microwave dielectric ceramic as claimed in claim 3, wherein said sinter is one prepared in a sintering atmosphere of at least one member selected from the group consisting of nitrogen and air.

6. A low-loss microwave dielectric ceramic as claimed in claim 1, wherein said Mn is obtained from at least one member selected from the group consisting of manganese oxides and manganese carbonates.

7. A low-loss microwave dielectric ceramic as claimed in claim 3, wherein said Mn is obtained from at least one member selected from the group consisting of manganese oxides and manganese carbonates.

8. A low-loss microwave dielectric ceramic as claimed in claim 1, wherein said perovskite type structure compound oxide is a calcined powder mixed with said small amount of Mn derived from an aqueous treating solution of $MnSO_4.4H_2O$.

9. A low-loss microwave dielectric ceramic as claimed in claim 3, wherein said perovskite type structure compound oxide is a calcined powder mixed with said small amount of Mn derived from an aqueous treating solution of $MnSO_4.4H_2O$.

10. A process for preparing a low-loss microwave dielectric ceramic comprising the steps of:
   (1) adding a small amount from 0.5 to 5 mol % of Mn to a perovskite type structure compound oxide powder consisting essentially singly or mainly of at least one member selected from the group consisting of $Ba(Zn_{\frac{1}{3}}Ta_{\frac{2}{3}})O_3$ and $Ba(Mg_{\frac{1}{3}}Ta_{\frac{2}{3}})O_3$
   (2) calcining the resultant mixture under a temperature within a range of 1200°–1400° C. to form Mn-treated oxide powder, and
   (3) sintering said Mn-treated oxide powder at a temperature within a range of 1550°–1600° C. for 1–3 hours.

11. A process as claimed in claim 10, wherein said perovskite type structure compound oxide powder further comprises less than 25 mol % of at least one member selected from the group consisting of $Ba(Zn_{\frac{1}{3}}Nb_{\frac{2}{3}})O_3$ and $Ba(Mg_{\frac{1}{3}}Nb_{\frac{2}{3}})O_3$.

12. A process as claimed in claim 10, wherein said sintering is carried out in a sintering atmosphere of at least one member selected from the group consisting of nitrogen and air.

13. A process as claimed in claim 11, wherein said sintering is carried out in a sintering atmosphere of at least one member selected from the group consisting of nitrogen and air.

14. A process as claimed in claim 10, wherein said small amount of Mn is obtained from at least one member selected from the group consisting of manganese oxides and manganese carbonates.

15. A process as claimed in claim 11, wherein said small amount of Mn is obtained from at least one member selected from the group consisting of manganese oxides and manganese carbonates.

16. A process as claimed in claim 10, wherein said perovskite type structure compound oxide is a calcined powder, and wherein said small amount of Mn is added to said perovskite type structure compound oxide by treating said calcined powder with an aqueous treating solution of $MnSO_4.4H_2O$.

17. A process as claimed in claim 11, wherein said perovskite type structure compound oxide is a calcined powder, and wherein said small amount of Mn is added to said perovskite type structure compound oxide by treating said calcined powder with an aqueous treating solution of $MnSO_4.4H_2O$.

* * * * *